(12) United States Patent
Wang et al.

(10) Patent No.: US 7,759,256 B2
(45) Date of Patent: Jul. 20, 2010

(54) MICRO-ELECTRO-MECHANICAL SYSTEM DEVICE AND METHOD FOR MAKING SAME

(75) Inventors: Chuan Wei Wang, HsinChu (TW); Hsin Hui Hsu, HsinChu (TW)

(73) Assignee: Pixart Imaging Incorporation, Hsin-Chu (TW)

( * ) Notice: Subject to any disclaimer, the term of this patent is extended or adjusted under 35 U.S.C. 154(b) by 0 days.

(21) Appl. No.: 12/284,234

(22) Filed: Sep. 18, 2008

(65) Prior Publication Data

US 2009/0115046 A1   May 7, 2009

(30) Foreign Application Priority Data

Oct. 17, 2007   (TW) .............................. 96138918 A

(51) Int. Cl.
*H01L 21/302* (2006.01)
*H01L 21/461* (2006.01)

(52) U.S. Cl. .................. 438/740; 438/53; 438/634; 257/E21.17; 257/E21.218; 257/E21.227; 257/E21.267; 257/E21.304; 257/E21.613; 257/E21.324

(58) Field of Classification Search ............... 438/50, 438/52, 53, 199, 634, 740, 680, 692, 769, 438/712, 733; 257/69, 127, 170, 288, 503
See application file for complete search history.

(56) References Cited

U.S. PATENT DOCUMENTS

| | | | | |
|---|---|---|---|---|
| 5,719,073 | A * | 2/1998 | Shaw et al. | 438/53 |
| 6,635,509 | B1 * | 10/2003 | Ouellet | 438/106 |
| 6,822,326 | B2 * | 11/2004 | Enquist et al. | 257/729 |
| 6,846,725 | B2 * | 1/2005 | Nagarajan et al. | 438/456 |
| 6,979,872 | B2 * | 12/2005 | Borwick et al. | 257/415 |
| 7,075,701 | B2 * | 7/2006 | Novotny et al. | 359/291 |

* cited by examiner

*Primary Examiner*—David Nhu
(74) *Attorney, Agent, or Firm*—Tung & Associates

(57) ABSTRACT

According to the present invention, a method for making a micro-electro-mechanical system (MEMS) device comprises: providing a substrate with devices and interconnection formed thereon, the substrate having a to-be-etched region; depositing and patterning an etch stop layer; depositing and patterning metal and via layers to form an MEMS structure, the MEMS structure including an isolation region between MEMS parts, an isolation region exposed upwardly, and an isolation region exposed downwardly, wherein the isolation region exposed downwardly is in contact with the etch stop layer; masking the isolation region exposed upwardly, and removing the isolation region between MEMS parts; and removing the etch stop layer.

12 Claims, 5 Drawing Sheets

MICRO-ELECTRO-MECHANICAL SYSTEM DEVICE AND METHOD FOR MAKING SAME

CROSS-REFERENCE

The present application claims priority to TW 096138918, filed on Oct. 17, 2007.

BACKGROUND OF THE INVENTION

1. Field of Invention

The present invention relates to a micro-electro-mechanical system (MEMS) device and a method for making same, in particular to a method for making an MEMS device which is compatible with a CMOS (Complementary Metal-Oxide-Silicon) manufacturing process.

2. Description of Related Art

MEMS devices can be applied in many applications, such as in accelerometer, gyro sensor, and so on. It is preferred that the method for making an MEMS device is compatible with a standard CMOS manufacturing process so that transistor devices and circuitry can be made in the front-end process, to be integrated with the MEMS structure made in the back-end process.

U.S. Pat. No. 6,458,615 proposes a method for making an MEMS device which involves silicon etch. Its drawback is that it requires etching the silicon wafer, which is difficult to control.

U.S. Pat. No. 6,238,580 proposes a method for making an MEMS device which involves oxide etch. However, it does not explain the details as to how to manufacture the fine MEMS structure, and how to avoid damages to the MEMS structure during oxide etch.

The present invention proposes a solution to the above mentioned drawbacks in the prior art.

SUMMARY OF THE INVENTION

It is a first objective of the present invention to provide a method for making an MEMS device which does not require silicon etch, and does not damage the MEMS structure during etch.

It is a second objective of the present invention to provide an MEMS device.

In accordance with the foregoing and other objectives of the present invention, and from one aspect of the present invention, a method for making an MEMS device comprises: providing a substrate with devices and interconnection formed thereon, the substrate having a to-be-etched region; depositing and patterning an etch stop layer; depositing and patterning metal and via layers to form an MEMS structure, the MEMS structure including an isolation region between MEMS parts, an isolation region exposed upwardly, and an isolation region exposed downwardly, wherein the isolation region exposed downwardly is in contact with the etch stop layer; masking the isolation region exposed upwardly, and removing the isolation region between MEMS parts; and removing the etch stop layer.

In the above method, preferably, the to-be-etched region is made of an oxide such as silicon dioxide. The etch stop layer is made of a material having high etch selectivity to oxide, such as silicon nitride, silicon oxynitride, titanium oxide, and titanium nitride.

Preferably, part of the interconnection forms a guard ring which, from top view, seals the to-be-etched region inside.

From another aspect of the present invention, an MEMS device is provided which comprises: a substrate; devices and interconnection formed on the substrate, the interconnection having a space inside; an MEMS structure on the interconnection; and an etch stop layer above the interconnection and below the MEMS structure.

In the above device, preferably, the etch stop layer is made of a material having high etch selectivity to oxide, such as silicon nitride, silicon oxynitride, titanium oxide, titanium nitride, and amorphous silicon. Preferably, part of the interconnection forms a guard ring which, from top view, seals the space inside.

It is to be understood that both the foregoing general description and the following detailed description are provided as examples, for illustration and not for limiting the scope of the invention.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

The drawings as referred to throughout the description of the present invention are for illustration only, but not drawn according to actual scale.

Figure 1A:
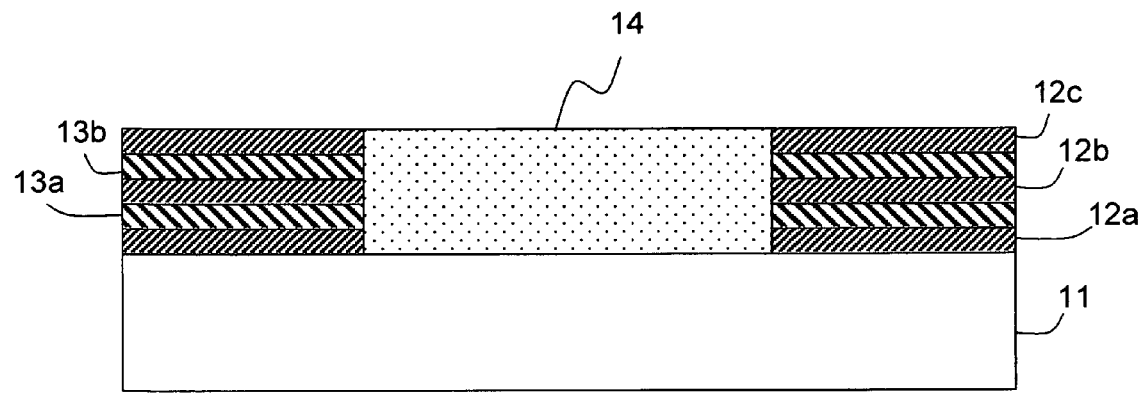
FIGS. 1A-1I is a schematic cross-sectional diagram showing an embodiment of the present invention.

FIGS. 1A-1I show a first embodiment of the present invention. Referring to FIG. 1A, a zero-layer wafer substrate 11 is provided, which for example can be a silicon wafer so that the process is compatible with a standard CMOS process. Next, transistor devices are formed by standard CMOS process steps as required (not shown). And next, an interconnection structure is formed, which includes a contact layer 12a, a first metal layer 13a, a first via layer 12b, a second metal layer 13b, and a second via layer 12c. What is shown in the figure is a two-metal-layer structure; in one embodiment, the contact layer and the via layer can be made by tungsten; the metal layer can be made by aluminum; the dielectric layer can be made by various oxides such as silicon dioxide. Of course, what is shown in the figure and described in the above is only for example. The interconnection can be made by other conductive and dielectric materials, and the structure can be formed by more layers of metal. An oxide region 14 is formed by a combination of the patterns of the layers 12a-12c and 13a-13b. For simplicity of the figure, the detailed pattern of each layer is not shown except the oxide region 14. The oxide region 14 for example can be made of silicon dioxide.

Figure 2:
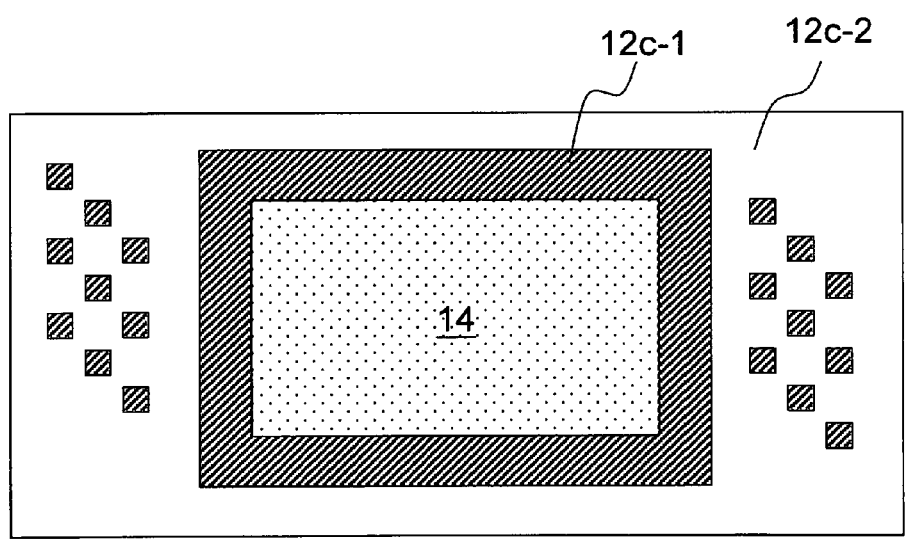
FIG. 2 shows the top view of FIG. 1A.

Referring to the top view of FIG. 2 which is taken from top of the layer 12c, the layer 12c includes the oxide region 14, a guard ring 12c-1 surrounding the oxide region 14, and a via pattern region 12c-2. Preferably, a guard ring pattern is formed in each of the layers 12a-12c and 13a-13b, and the guard ring patterns of the layers 12a-12c and 13a-13b are connected with one another to seal the oxide region 14 inside, so that during later etching of the oxide region 14, the dielectric material in the via pattern region 12c-2 (and in the region beneath it) will not be damaged. The guard rings of the layers 12a-12c and 13a-13b are only required to be connected with one another; they do not have to be of the same shape, nor aligned with one another.

Figure 1B:
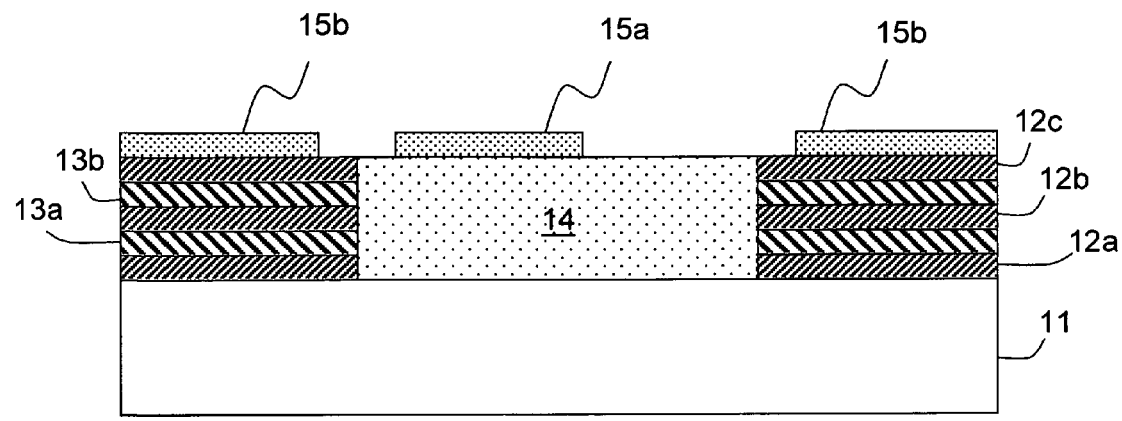

Referring to FIG. 1B, after the steps of FIG. 1A, a nitride layer such as silicon nitride is deposited and patterned (by photolithography and etch, for example) to form separated nitride regions 15a and 15b. The purpose to deposit a nitride layer is to provide an etch stop layer for later etching of the oxide region 14; to this end, any material with high etch selectivity to oxide can be used, not limited to silicon nitride. Other materials such as silicon oxynitride, titanium oxide, titanium nitride, amorphous silicon, and so on, can be used as the etch stop layer.

Figure 1C:
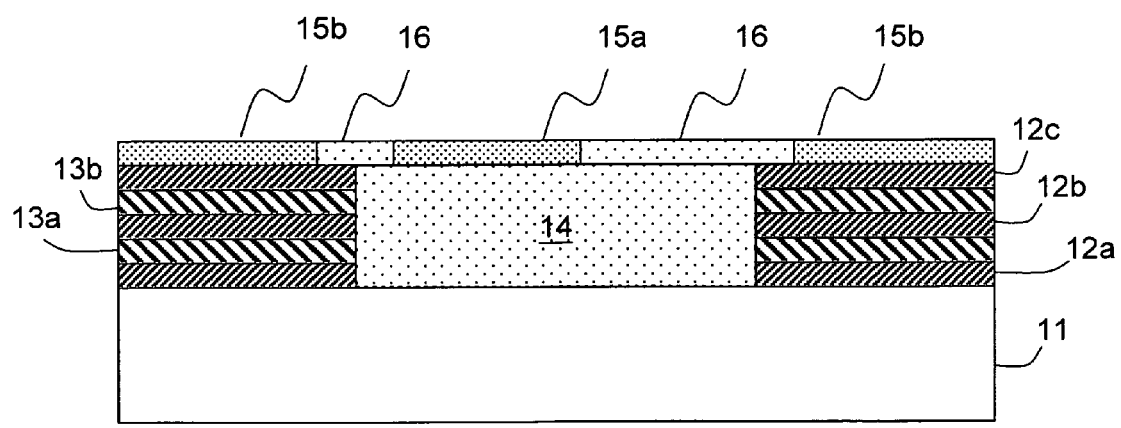

Referring to FIG. 1C, an oxide layer 16, such as silicon dioxide, is deposited and planarized, for example by chemical-mechanical polish (CMP). This is an optional step and may be omitted.

Figure 1D:
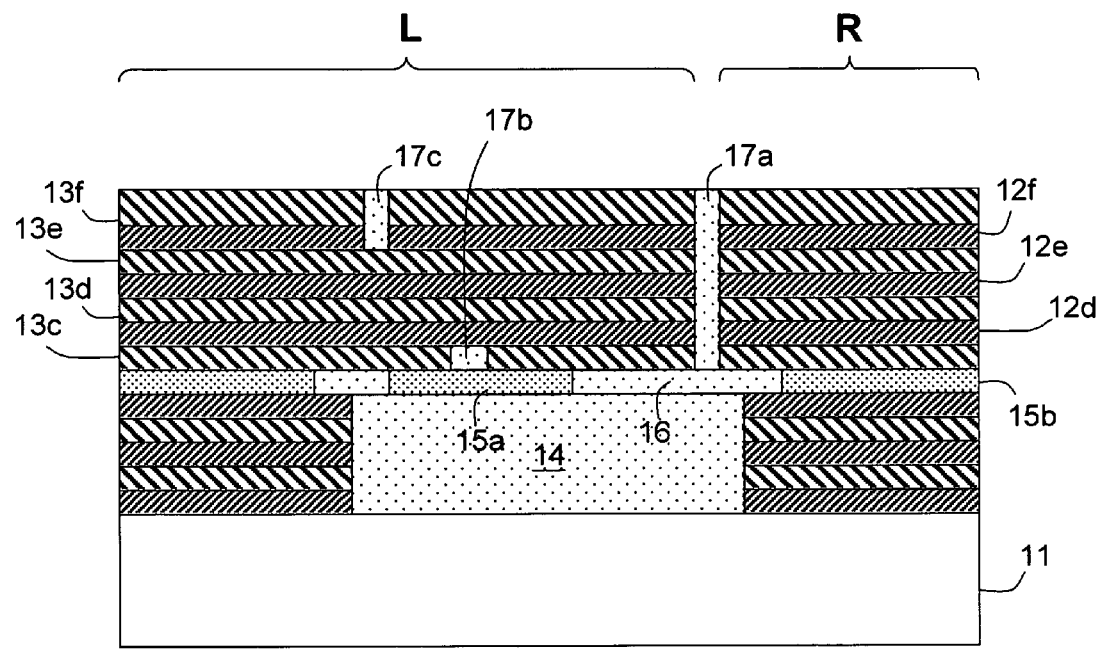

Referring to FIG. 1D, an MEMS structure including via layers 12d-12f and metal layers 13c-13f is formed on the substrate. For electrical and mechanical requirements, some parts of the MEMS structure may have to be isolated from some other parts of the MEMS structure. For example, two parts L and R are shown in the figure which are isolated with each other by an oxide region 17a. In addition, in the MEMS structure, there might be some oxide regions exposed upwardly and some other oxide regions exposed downwardly, such as the regions 17b and 17c shown in the figure. Note that because of the etch stop layer 15a, the oxide region 17b is not in contact with the oxide region 14. The oxide regions 17a-17c serve to isolate the MEMS parts.

Figure 1E:
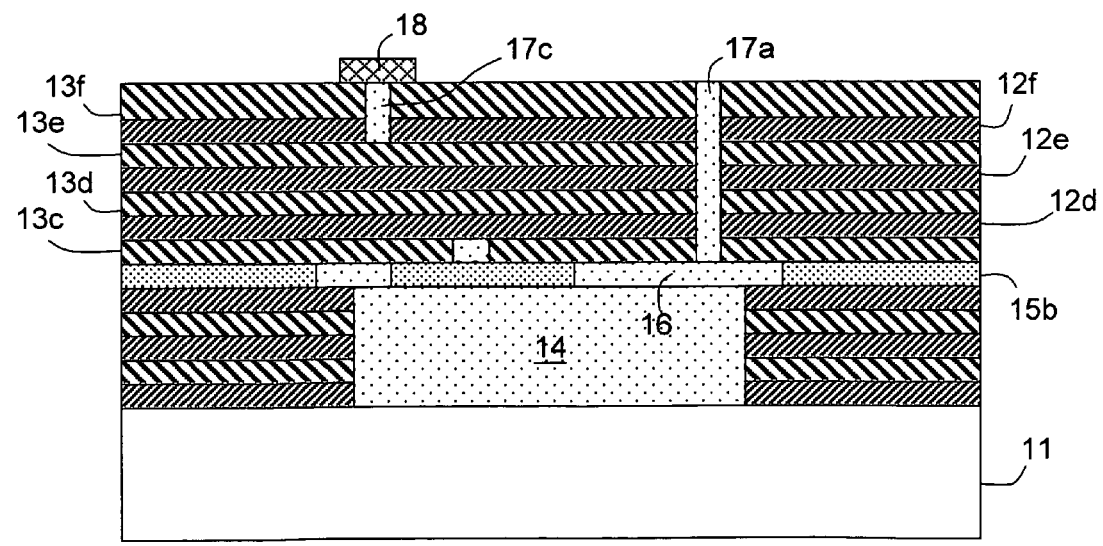

Referring to FIG. 1E, a photoresist layer 18 is coated and patterned, to mask the oxide region 17c.

Figure 1F:
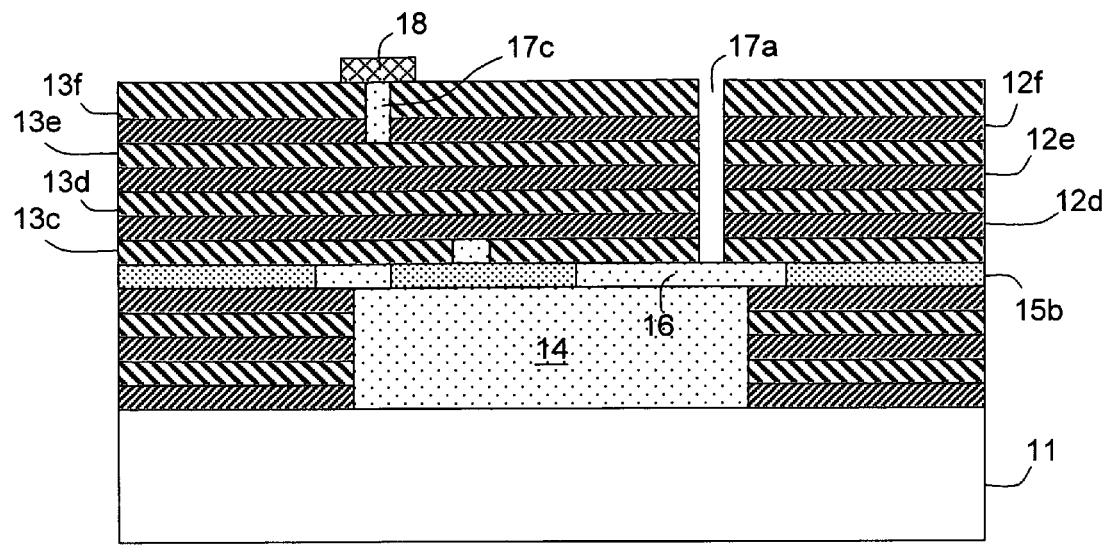

Next in FIG. 1F, with the photoresist layer 18 as a mask, an oxide etch is performed to removed the oxide inside the region 17a. The etch for example can be anisotropic reactive ion etch.

Figure 1G:
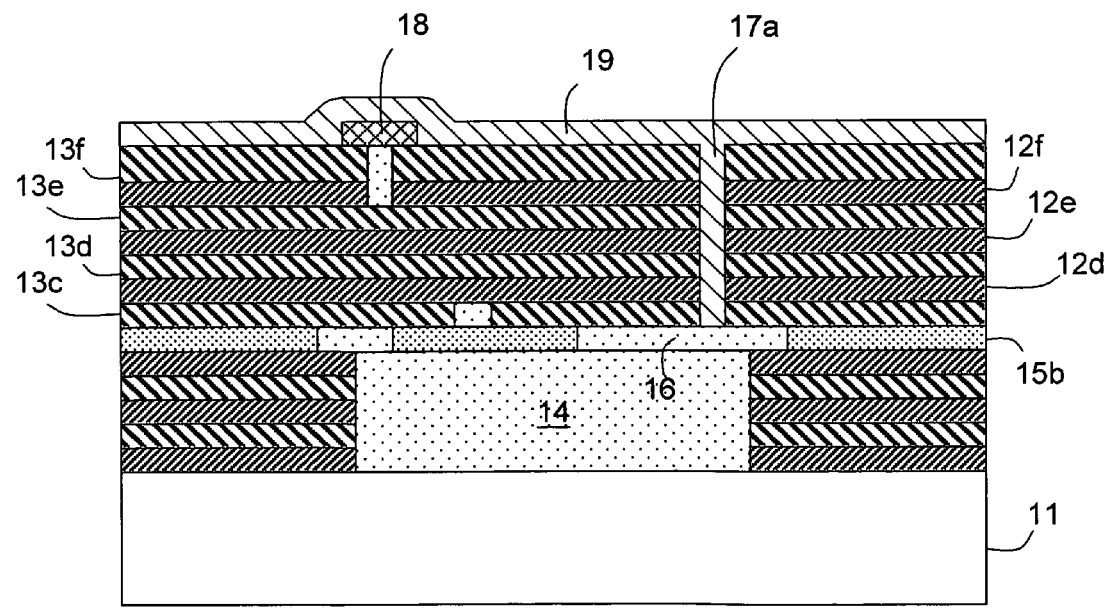

Next in FIG. 1G, another photoresist layer 18 is coated, which also fills inside the region 17a.

Figure 1H:
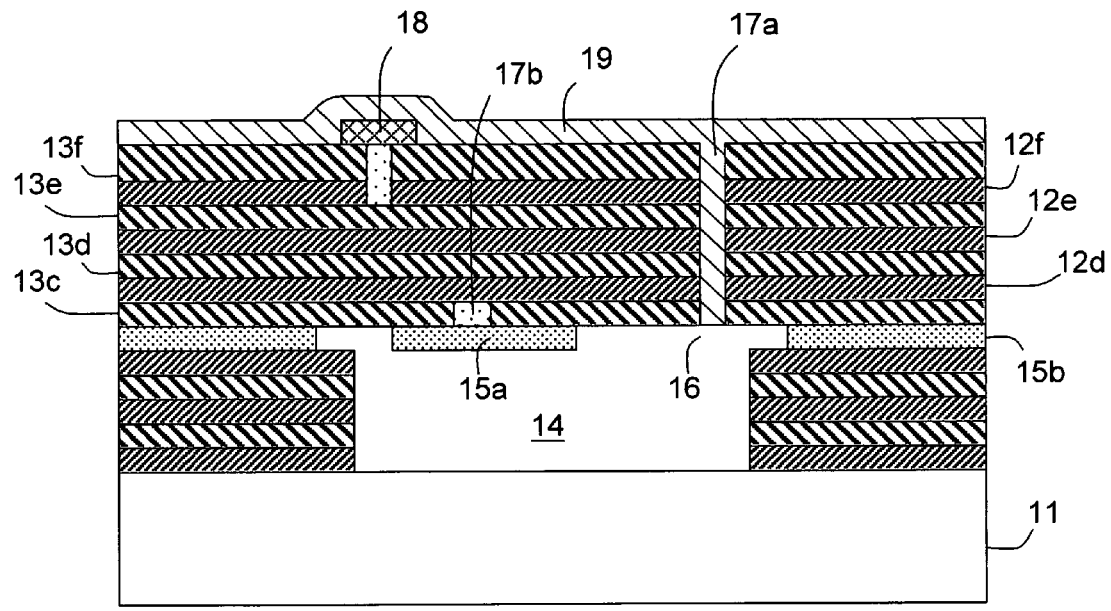

Referring to FIG. 1H, an oxide etch step is performed. The etch for example can be HF (hydrogen fluoride) vapor etch, or BOE (buffered oxide etch) by immersing the whole wafer in an acid tank. Although the top surface of the substrate is covered by the photoresist layer 19, etching can proceed on the oxide regions 14 and 16 from the side surface of the substrate (vertical direction with reference to the paper surface). Note that the guard ring (FIG. 2) and the nitride regions 15a and 15b help to protect the dielectric material in the metal and via layers of the interconnection and the oxide region 17b, so that they are not damaged by oxide etch.

Figure 1I:
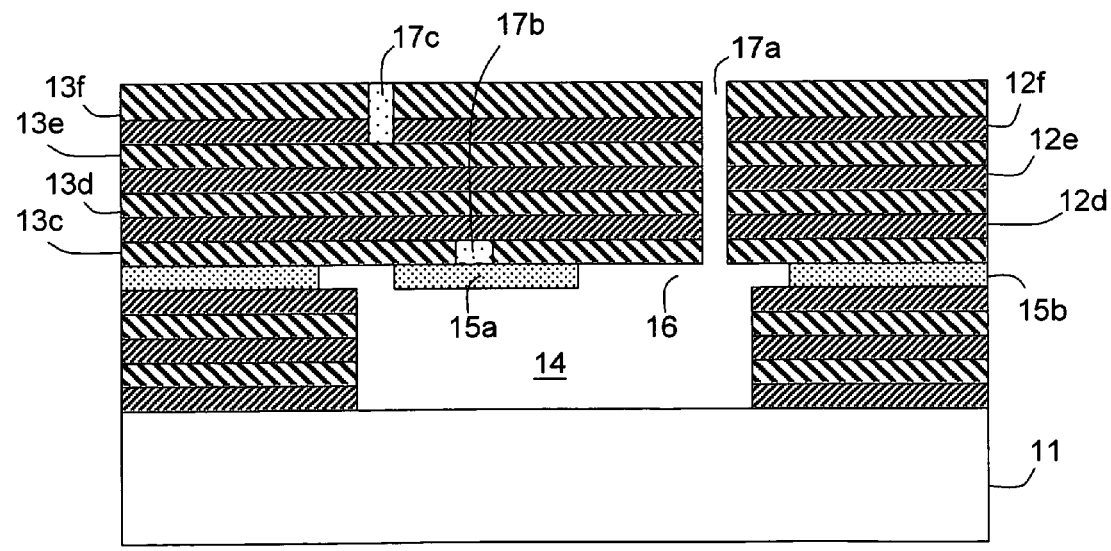

At last, as shown in FIG. 1I, the photoresist layers 18 and 19 are removed, and a desired MEMS structure is obtained, in which the regions 14, 16 and 17a are hollow spaces.

Compared with prior art, the present invention is better because it does not require etching the silicon wafer, and furthermore the MEMS structure is not damaged during oxide etch.

Although the present invention has been described in detail with reference to a preferred embodiment thereof, the description is for illustrative purpose and not for limiting the scope of the invention. For example, the two oxide etch steps shown in FIGS. 1F-1H as a preferred embodiment can be replaced by one oxide etch step. As another example, the nitride and oxide formation steps in FIGS. 1B and 1C can be interchanged. As a further example, in the above-described embodiment the metal is aluminum and the dielectric material is silicon dioxide, but other materials can be used, such as copper (for metal) and low dielectric constant materials (for dielectric material). One skilled in this art can readily think of many modifications and variations in light of the teaching by the present invention. In view of the foregoing, it is intended that the present invention cover all such modifications and variations, which should be interpreted to fall within the scope of the following claims and their equivalents.

What is claimed is:

1. A method for making a micro-electro-mechanical system (MEMS) device, comprising:
    providing a substrate with devices and interconnection formed thereon, the substrate having a to-be-etched region;
    depositing and patterning an etch stop layer;
    depositing and patterning metal and via layers to form an MEMS structure, the MEMS structure including an isolation region between MEMS parts, an isolation region exposed upwardly, and an isolation region exposed downwardly, wherein the isolation region exposed downwardly is in contact with the etch stop layer;
    masking the isolation region exposed upwardly, and removing the isolation region between the MEMS parts; and
    removing the etch stop layer.

2. The method for making a MEMS device according to claim 1, wherein the to-be-etched region is made of oxide.

3. The method for making a MEMS device according to claim 1, wherein the to-be-etched region is made of silicon dioxide.

4. The method for making a MEMS device according to claim 1, wherein the etch stop layer is made of a material selected from silicon nitride, silicon oxynitride, titanium oxide, titanium nitride, and amorphous silicon.

5. The method for making a MEMS device according to claim 1, wherein the isolation region between MEMS parts is removed by anisotropic reactive ion etch.

6. The method for making a MEMS device according to claim 1, wherein the to-be-etched region is removed by HF vapor etch or buffered oxide etch.

7. The method for making a MEMS device according to claim 1, further comprising: after depositing and patterning the etch stop layer, depositing and planarizing a material layer.

8. The method for making a MEMS device according to claim 7, wherein the planarizing step includes: chemical-mechanical polishing the material layer.

9. The method for making a MEMS device according to claim 7, wherein the material layer is made of a material which is the same as the material of the to-be-etched region.

10. The method for making a MEMS device according to claim 1, wherein part of the interconnection forms a guard ring which seals the to-be-etched region inside.

11. A micro-electro-mechanical system (MEMS) device, comprising:
    a substrate;
    devices and interconnection formed on the substrate, the interconnection having a space inside;
    an MEMS structure on the interconnection; and
    an etch stop layer above the interconnection and below the MEMS structure,
    wherein part of the interconnection forms a guard ring which completely seals horizontal surrounding of the space.

12. The MEMS device of claim 11, wherein the etch stop layer is made of a material selected from silicon nitride, silicon oxynitride, titanium oxide, and titanium nitride.

* * * * *